US012176639B2

(12) United States Patent
Straka et al.

(10) Patent No.: US 12,176,639 B2
(45) Date of Patent: Dec. 24, 2024

(54) ELECTRICAL CONNECTOR FOR ATTACHMENT TO TEXTILE (71) Applicant: MYANT INC., Toronto (CA)

(72) Inventors: Adrian Straka, Toronto (CA); Michelle Zheng, Toronto (CA); Calvin Fook-Lam Kwok, Toronto (CA); Christopher Robin Leiphart, Toronto (CA); Yuki Koyama, Toronto (JP); Kiyoshi Asai, Toronto (JP); Toshihiko Kato, Toronto (JP)

(73) Assignee: MYANT INC., Toronto (CA)

( * ) Notice: Subject to any disclaimer, the term of this patent is extended or adjusted under 35 U.S.C. 154(b) by 354 days.

(21) Appl. No.: 17/789,412

(22) PCT Filed: Dec. 23, 2020

(86) PCT No.: PCT/CA2020/051790
§ 371 (c)(1),
(2) Date: Jun. 27, 2022

(87) PCT Pub. No.: WO2021/127783
PCT Pub. Date: Jul. 1, 2021

(65) Prior Publication Data
US 2023/0045382 A1    Feb. 9, 2023

(30) Foreign Application Priority Data
Dec. 25, 2019 (JP) .................... 2019-234861

(51) Int. Cl.
*H01R 12/00* (2006.01)
*H01R 12/61* (2011.01)
(Continued)

(52) U.S. Cl.
CPC ............. *H01R 12/61* (2013.01); *H01R 12/77* (2013.01); *H01R 13/24* (2013.01); *H01R 13/504* (2013.01); *H05K 1/028* (2013.01); *H05K 1/038* (2013.01)

(58) Field of Classification Search
CPC ........ H01R 12/61; H01R 12/77; H01R 13/24; H01R 13/504; H05K 1/628; H05K 1/038
See application file for complete search history.

(56) References Cited

U.S. PATENT DOCUMENTS 5,736,681 A    4/1998  Yamamoto et al.
6,097,607 A *  8/2000  Carroll ................... H01R 12/77
                                                174/268
(Continued)

FOREIGN PATENT DOCUMENTS

CA    2632901 A1    2/2007
CA    3087463 A1    7/2019
(Continued)

OTHER PUBLICATIONS

Canadian Intellectual Property Office (CIPO), International Search Report and Written Opinion issued to PCT/CA2020/051790, Mar. 2, 2021.

*Primary Examiner* — Phuong Chi Thi Nguyen
(74) *Attorney, Agent, or Firm* — Norton Rose Fulbright Canada LLP (57) ABSTRACT An electrical connector is provided. The electrical connector is to be attached to a cloth in which a conductive pattern is formed. The electrical connector includes an insulating housing having a boss portion provided on a surface of the housing, where the surface is to be in contact with the cloth, and the boss portion is inserted into the cloth; a connection terminal provided to the housing; and a conductive pad provided around the boss portion on the surface of the housing, where the surface is to be in contact with the cloth, (Continued)

and the conductive pad is electrically connected to the connection terminal. The conductive pad has a protrusion protruding in the same direction as the boss portion of the housing protrudes.

13 Claims, 10 Drawing Sheets

(51) Int. Cl.
*H01R 12/77* (2011.01)
*H01R 13/24* (2006.01)
*H01R 13/504* (2006.01)
*H05K 1/02* (2006.01)
*H05K 1/03* (2006.01)

(56) References Cited

U.S. PATENT DOCUMENTS

| | | | |
|---|---|---|---|
| 8,758,241 B2 * | 6/2014 | Charles, Jr. ............. | G06F 1/163 361/728 |
| 2010/0149767 A1 | 6/2010 | Biesheuvel et al. | |
| 2020/0388936 A1 | 12/2020 | Koyama et al. | |

FOREIGN PATENT DOCUMENTS

| | | |
|---|---|---|
| JP | 2009-1 05027 A1 | 5/2009 |
| JP | 2010-068163 A1 | 3/2010 |
| KR | 20140008971 A1 | 1/2014 |
| KR | 10-2018-0051323 A1 | 5/2018 |
| WO | 2018087489 A1 | 5/2018 |

\* cited by examiner

ELECTRICAL CONNECTOR FOR ATTACHMENT TO TEXTILE

CROSS-REFERENCED TO RELATED APPLICATIONS

This application claims all benefit including priority to Japanese Patent Application No. 2019-234861, filed Dec. 25, 2019, and entitled "ELECTRICAL CONNECTOR"; the entire contents of which are hereby incorporated by reference herein.

FIELD

The present disclosure relates to electrical connectors.

BACKGROUND

A connection structure in which a boss portion formed on a grounding terminal is cut into the grounded surface of a conductive metal housing is known. A technique to attach, to a textile substrate, a board for connecting a connector is also known.

SUMMARY

When an electrical connector is attached to a cloth to contact a conductive pattern of the cloth, better contact with the conductive pattern of the cloth may be desirable. This is addressed, at least in part, by some embodiments of an electrical connector disclosed herein.

According to an aspect, an electrical connector is provided. The electrical connector is to be attached to a cloth in which a conductive pattern is formed. The electrical connector includes an insulating housing having a boss portion provided on a surface of the housing, where the surface is to be in contact with the cloth, and the boss portion is inserted into the cloth. The electrical connector includes a connection terminal provided to the housing. The electrical connector includes a conductive pad provided around the boss portion on the surface of the housing, where the surface is to be in contact with the cloth, and the conductive pad is electrically connected to the connection terminal. The conductive pad has a protrusion protruding in the same direction as the boss portion of the housing protrudes.

In some embodiments, the electrical connector may further include an insulating plate for placing the cloth between the plate and the housing.

In some embodiments, a hole for receiving the boss portion may be formed in the plate.

In some embodiments, the plate has a first annular projecting portion provided on a surface of the plate, where the surface is to be in contact with the cloth, and the first projecting portion may have a flat surface configured to be aligned with the protrusion.

In some embodiments, the plate may have a plurality of second projecting portions provided around the hole on the surface to be in contact with the cloth.

In some embodiments, the plate may have a first annular projecting portion provided on the surface to be in contact with the cloth and having a flat surface aligned with the protrusion.

In some embodiments, the plurality of second projecting portions may be provided outside the first projecting portion and protrude above the flat surface of the first projecting portion.

In some embodiments, the first projecting portion and the plurality of second projecting portions may be provided integral with the plate.

In some embodiments, the first projecting portion may be a member separate from the plate.

In some embodiments, the first projecting portion may have a shape touching the plurality of second projecting portions located outside the first projecting portion.

In some embodiments, the hole may be a through-hole penetrating from the surface to be in contact with the cloth to a surface opposite to the surface to be in contact with the cloth.

In some embodiments, a part of the boss portion that protrudes out of the through-hole may be fixed to the plate by thermal welding or thermocompression bonding.

In some embodiments, a tip of the boss portion may be sharpened.

In some embodiments, the plurality of boss portions and the plurality of conductive pads may be provided.

Other features will become apparent from the drawings in conjunction with the following description.

BRIEF DESCRIPTION OF DRAWINGS

In the figures which illustrate example embodiments.

DETAILED DESCRIPTION

Aspects of various embodiments are described through reference to the drawings. Hereinafter, identical or similar portions in drawings are given identical reference numbers, and the same explanation is omitted in some cases.

Figure 1:
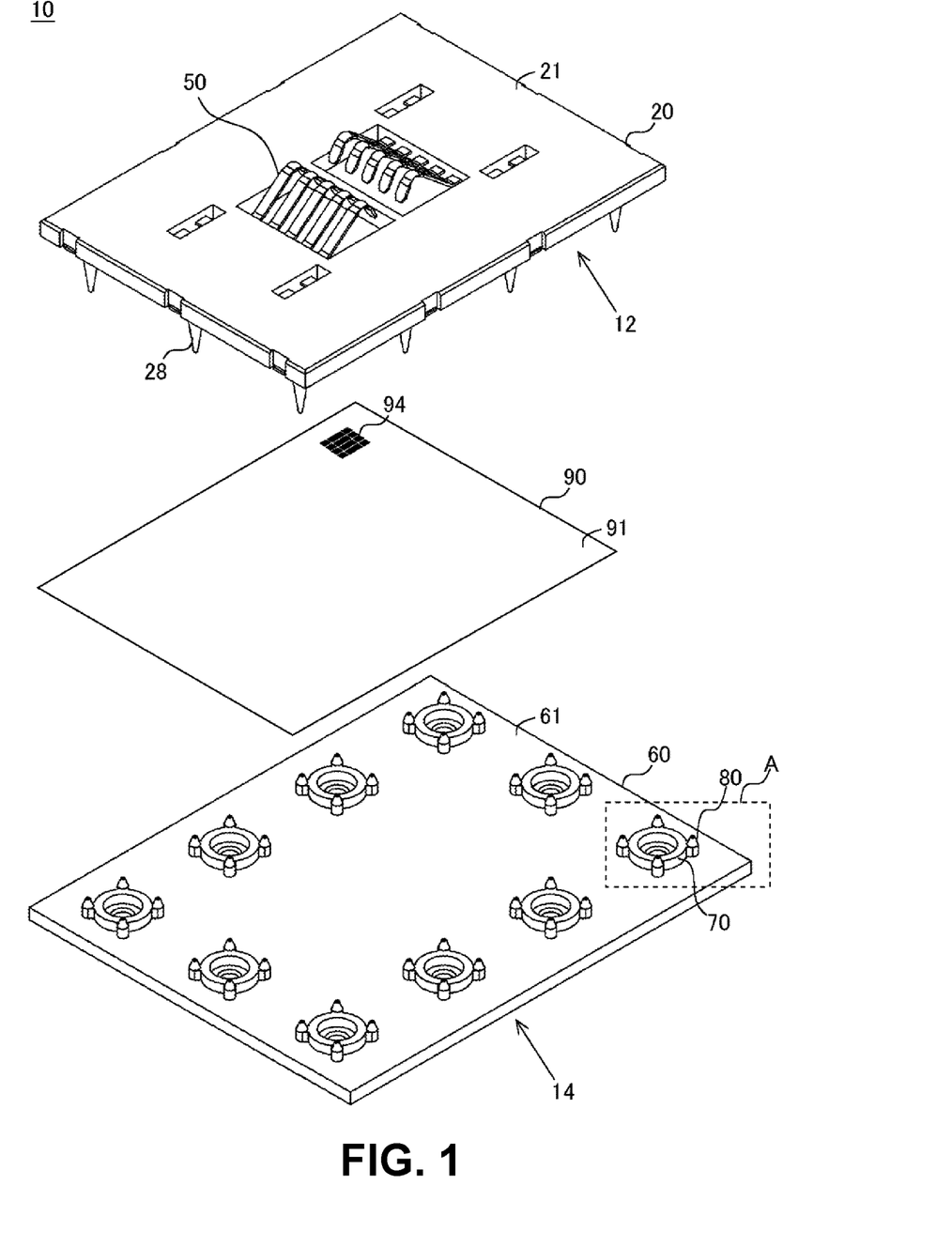
FIG. 1 is an exploded perspective view of an electrical connector as viewed from an upper surface side of the electrical connector, in accordance with an embodiment.
Figure 2:
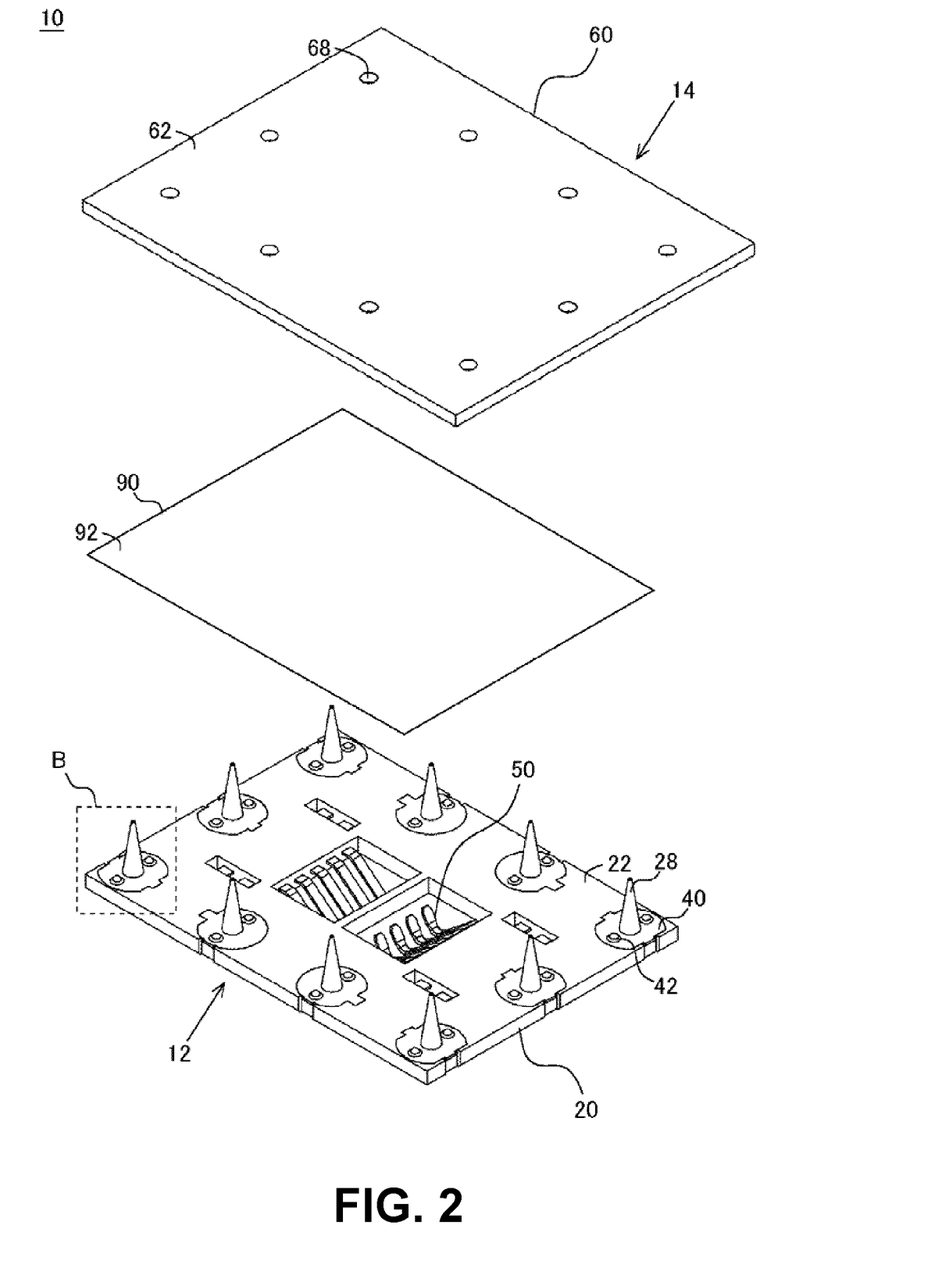
FIG. 2 is an exploded perspective view of the electrical connector of FIG. 1, as viewed from a lower surface side of the electrical connector, in accordance with an embodiment.

FIGS. 1 and 2 are exploded perspective views of an electrical connector 10 according to one embodiment. FIG.

Figure 3:
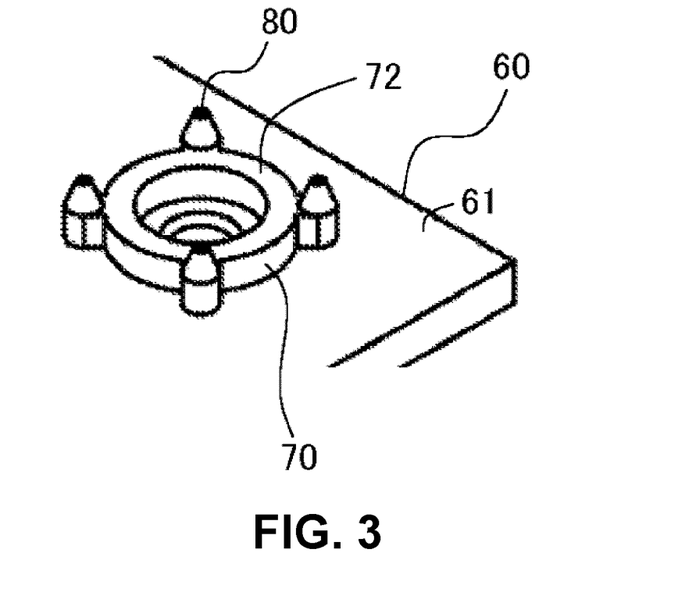
FIG. 3 is an enlarged view of a part A in FIG. 1, in accordance with an embodiment.
Figure 4:
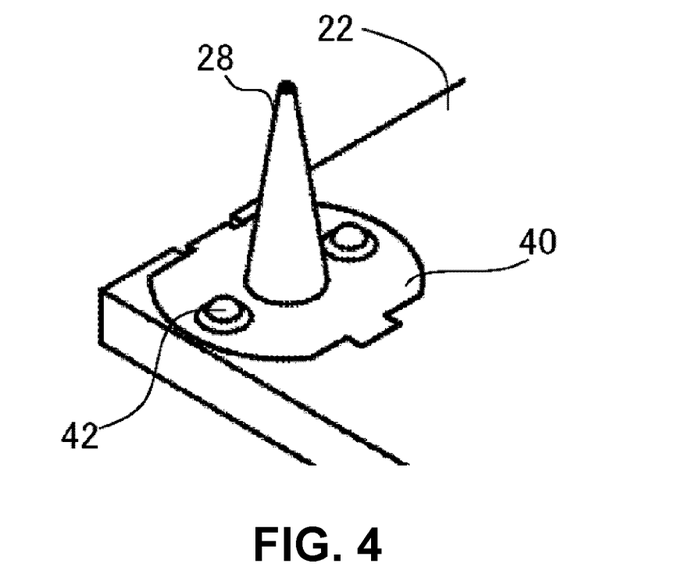
FIG. 4 is an enlarged view of a part B in FIG. 2, in accordance with an embodiment.

1 is an exploded perspective view of an electrical connector 10 as viewed from an upper surface side of the electrical connector 10, while FIG. 2 is an exploded perspective view of the electrical connector 10 as viewed from a lower surface side of the electrical connector 10. The electrical connector 10 is to be attached to a cloth 90. FIGS. 1 and 2 shows the electrical connector 10 before it is attached to the cloth 90. FIG. 3 is an enlarged view of a part A in FIG. 1. FIG. 4 is an enlarged view of a part B in FIG. 2.

The cloth 90 forms a part of a garment, an undergarment, or the like. The cloth 90 has a conductive pattern 94 formed therein. The conductive pattern 94 has a portion formed on an upper surface 91 of the cloth 90. The conductive pattern 94 may be formed by weaving conductive yarn into the cloth 90. The conductive pattern 94 may be formed by adhesion to the cloth 90. For example, the conductive pattern 94 may be formed in the cloth 90 by printing the pattern in conductive ink on the cloth 90.

The electrical connector 10 is a connector for transmitting at least one of electrical energy and an electrical signal between the conductive pattern 94 and external equipment connected to the electrical connector 10. For example, the electrical connector 10 may transmit electrical power provided by a power supply to the conductive pattern 94. The conductive pattern 94 may supply the electrical power to a vital sensor provided to a garment or an undergarment. The electrical connector 10 may obtain an electrical signal output by the vital sensor via the conductive pattern 94, and output the signal to an external communication device.

The electrical connector 10 includes a first member 12 and a second member 14. The first member 12 has a housing 20, a conductive pad 40 and a connection terminal 50. The housing 20 is an insulating member. The housing 20 is formed of, for example, resin.

The housing 20 has an upper surface 21 and a lower surface 22. The connection terminal 50 is fixed to the housing 20 so as to protrude from the upper surface 21 of the housing 20. The lower surface 22 of the housing 20 is a surface to be in contact with the cloth 90. To be specific, the lower surface 22 of the housing 20 is to be in contact with the upper surface 91 of the cloth 90.

As used in this embodiment, the terms indicating an up-and-down relationship such as "upper surface", "lower surface" and "up-and-down direction" represent orientations given under the assumption that one surface of the housing 20 is an upper surface and the opposite surface of the housing 20 is a lower surface. As used in this embodiment, the terms indicating the up-and-down relationship are irrelevant to the up-and-down relationship in the vertical direction.

The housing 20 has a boss portion 28. The boss portion 28 is provided on the lower surface 22. A plurality of boss portions 28 is provided. A tip of the boss portion 28 is sharpened. The boss portion 28 is to be inserted into the cloth 90.

The conductive pad 40 is electrically connected to the connection terminal 50. The conductive pad 40 is provided on the lower surface 22 of the housing 20. The conductive pad 40 is provided around the boss portion 28. The conductive pad 40 is provided so as to encircle the boss portion 28.

As shown in FIG. 1 and FIG. 4, the conductive pad 40 has a protrusion 42 protruding in the same direction as the boss portion 28 of the housing 20 does. A plurality of conductive pads 40 is provided. The conductive pads 40 are provided individually to each of the boss portions 28.

The second member 14 has a plate 60. The plate 60 is an insulating member. The plate 60 has an upper surface 61 and a lower surface 62. The upper surface 61 of the plate 60 is a surface to be in contact with the cloth 90. To be specific, the upper surface 61 of the plate 60 is to be in contact with a lower surface 92 of the cloth 90. The lower surface 62 is a surface opposite to the upper surface 61.

The plate 60 is used to place the cloth 90 between the plate 60 and the housing 20. The electrical connector 10 is fixed to the cloth 90 by placing the cloth 90 between the housing 20 and the plate 60.

A hole 68 for receiving the boss portion 28 is formed through the plate 60. The hole 68 is a through-hole penetrating from the upper surface 61 to the lower surface 62 of the plate 60.

As shown in FIG. 1 and FIG. 3, the plate 60 is provided with a first annular projecting portion 70 and a second projecting portion 80. The first projecting portion 70 and the second projecting portion 80 are provided on the upper surface 61 of the plate 60. The first projecting portion 70 and the second projecting portion 80 are provided around the hole 68. In this embodiment, the first projecting portion 70 and the plurality of second projecting portions 80 are molded integrally with a member forming the plate 60.

The first projecting portion 70 has a flat surface 72 on the top. The flat surface 72 is aligned with the protrusion 42 of the conductive pad 40 so as to face the protrusion. The second projecting portion 80 is provided outside the first projecting portion 70. The plurality of second projecting portions 80 is provided for each first projecting portion 70, at positions around the periphery of that first projecting portion 70. The second projecting portion 80 is provided such that it protrudes above the flat surface 72 of the first projecting portion 70. The second projecting portion 80 has a spike-like shape. The tip of the second projecting portion 80 has a frustoconical shape.

Figure 5:
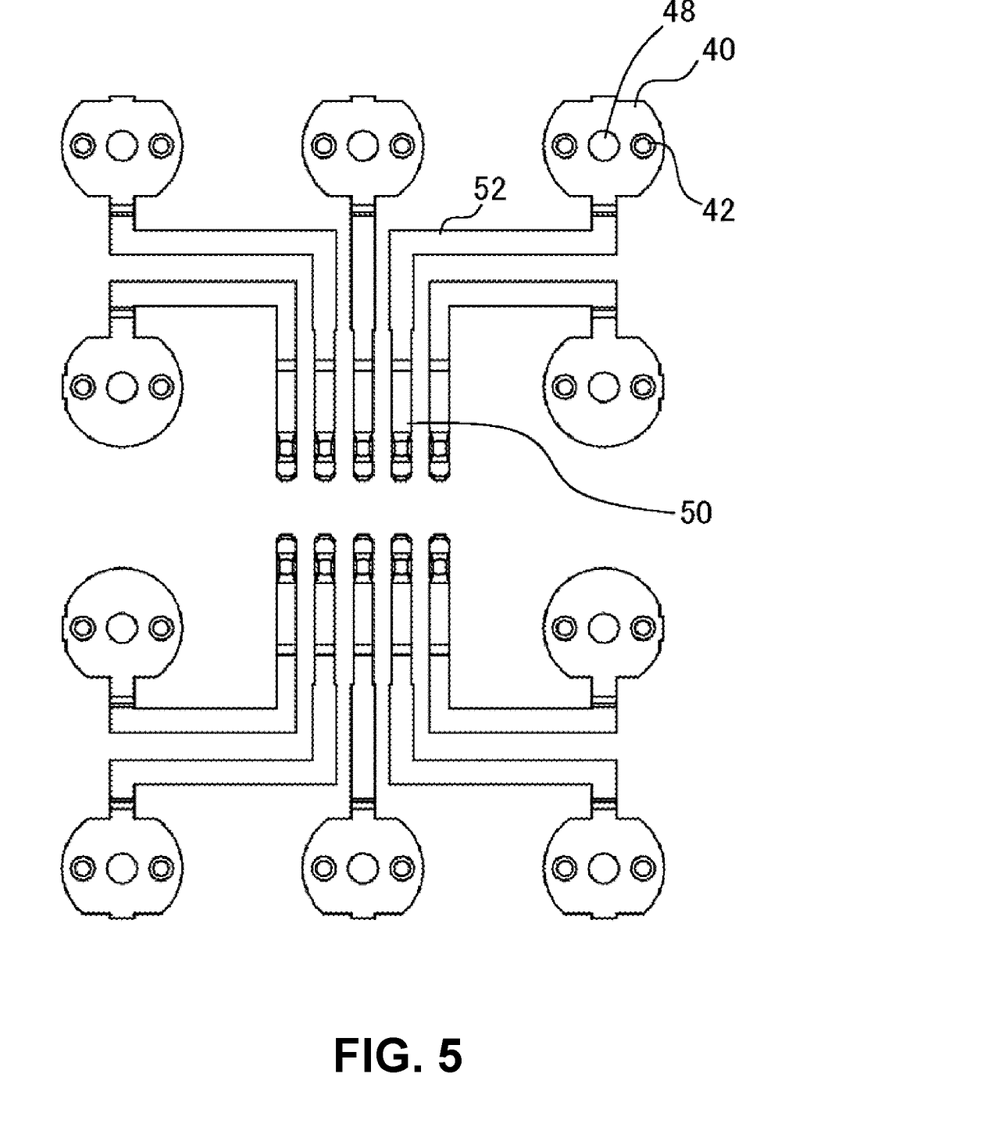
FIG. 5 is a plan view showing how a connection terminal and a conductive pad are connected to each other, in accordance with an embodiment.

FIG. 5 is a plan view showing how the connection terminal 50 and the conductive pad 40 are connected to each other. The connection terminals 50 and the conductive pads 40 are provided in a one-to-one correspondence. The conductive pad 40 is connected to the corresponding connection terminal 50 through a wiring portion 52. The wiring portion 52 is fixed inside the housing 20.

The conductive pad 40 has a substantially annular shape. A through-hole 48 is formed through the conductive pad 40. The through-hole 48 is a hole through which the boss portion 28 is inserted.

Figure 6:
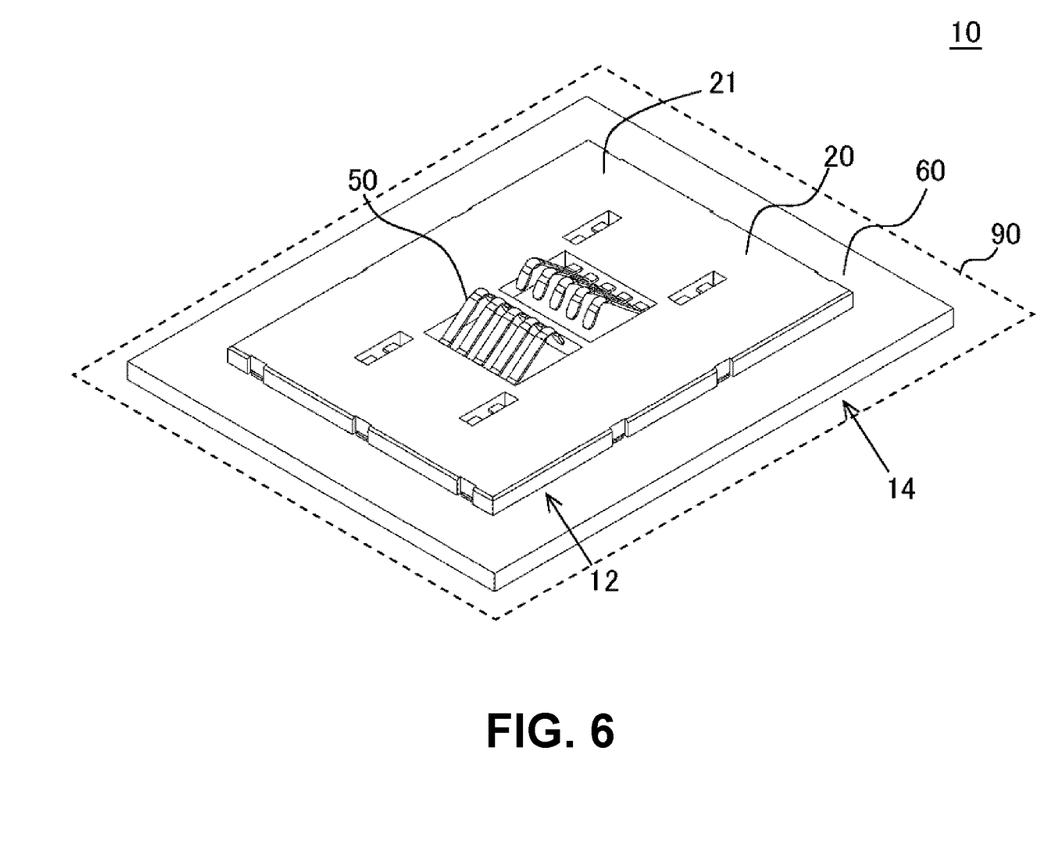
FIG. 6 is a perspective view showing a housing and a plate, in accordance with an embodiment.

FIG. 6 is a perspective view showing the housing 20 and the plate 60. The FIG. 6 is a perspective view showing the housing 20 and the plate 60 in an assembled condition. In FIG. 6, the cloth 90 is shown with a dotted line to clearly show the housing 20 and the plate 60 in the assembled condition.

Figure 7:
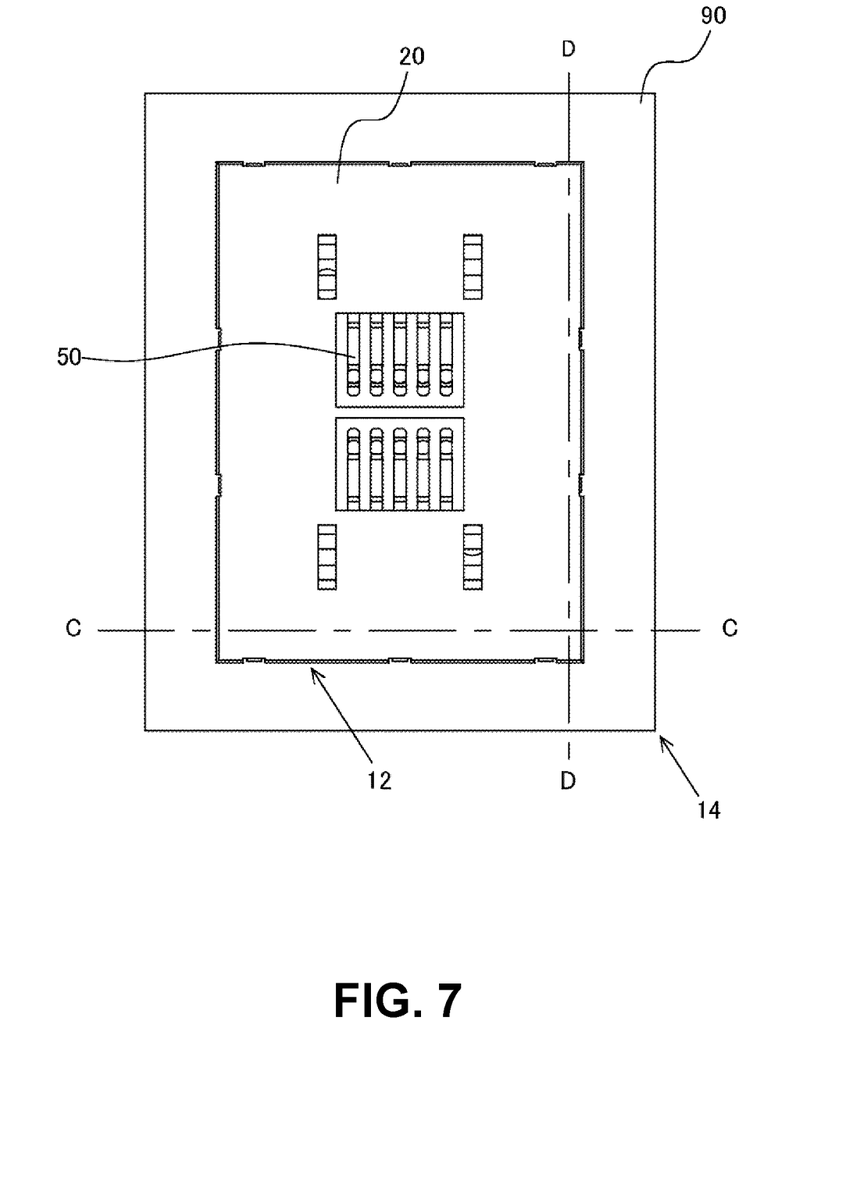
FIG. 7 is a top view of the electrical connector of FIG. 1 in a condition where it is attached to a cloth, in accordance with an embodiment.
Figure 8:
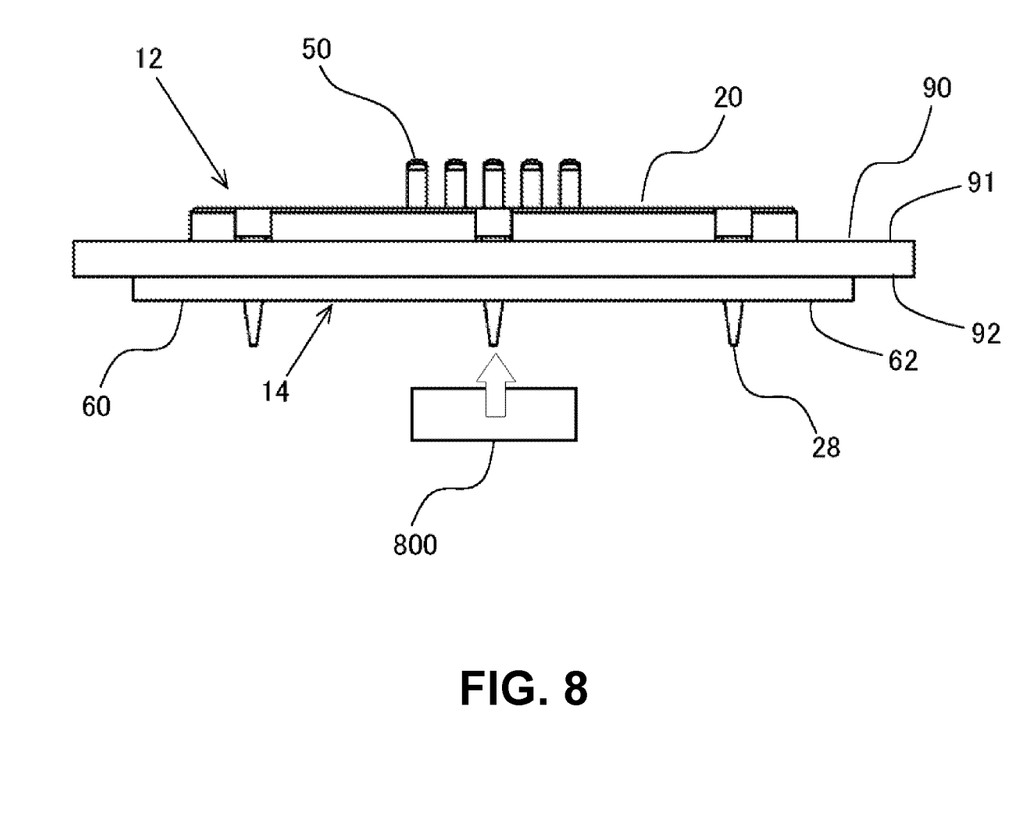
FIG. 8 is a lateral view showing the housing and the plate of FIG. 1 in an assembled condition, in accordance with an embodiment.

FIG. 7 is a top view of the electrical connector 10 in a condition where it is attached to a cloth 90. FIG. 8 is a lateral view showing the housing 20 and the plate 60 in an assembled condition.

As shown in FIG. 8, when the housing 20 and the plate 60 are assembled, the tip portion of the boss portion 28 protrudes from the lower surface 62 of the plate 60. Under this condition, a thermal plate 800 is pressed against the tip portion of the boss portion 28 protruding from the plate 60. As a result, the tip portion of the boss portion 28 melts by heat and adheres to the plate 60. In this manner, a part of the boss portion 28 that protrudes out of the hole 68 of the plate 60 is fixed to the plate 60 by thermal welding.

Alternatively, the tip portion of the boss portion 28 may be fixed to the plate 60 through plastic deformation by heat. For example, a part of the boss portion 28 that protrudes out of the hole 68 may be fixed to the plate 60 through plastic deformation by thermocompression bonding.

Figure 9:
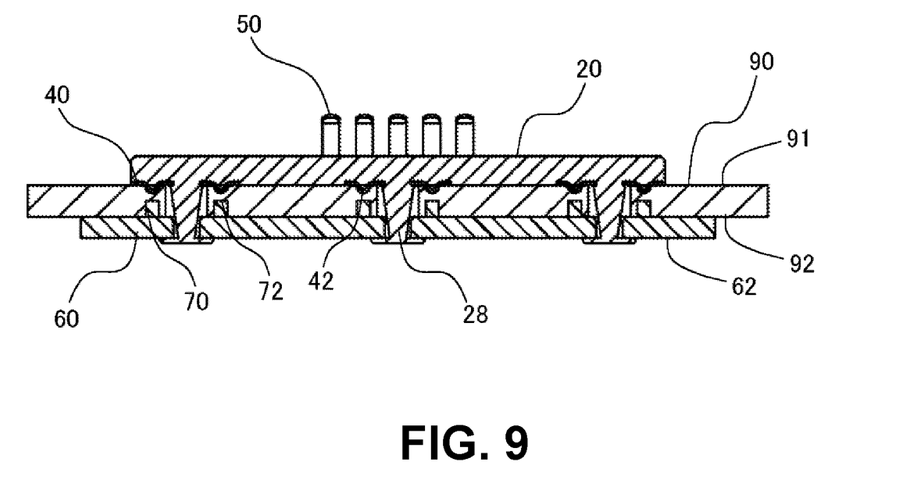
FIG. 9 is a cross-sectional view of the electrical connector of FIG. 1 attached to the cloth of FIG. 7, in accordance with an embodiment.

FIG. 9 is a cross-sectional view of the electrical connector 10 attached to the cloth 90. FIG. 9 shows a cross section taken along a CC line in FIG. 7.

As show in FIG. 9, the flat surface 72 of the first projecting portion 70 is provided such that it is aligned with the protrusion 42 of the conductive pad 40 in the up-and-down direction. Therefore, when the housing 20 and the plate 60 are assembled, the flat surface 72 of the first projecting portion 70 presses the cloth 90 against the protrusion 42 of the conductive pad 40. In this way, the conductive pattern 94 in the cloth 90 can be kept pressed hard against the conductive pad 40. Accordingly, better contact can be achieved between the conductive pattern 94 and the conductive pad 40.

Figure 10:
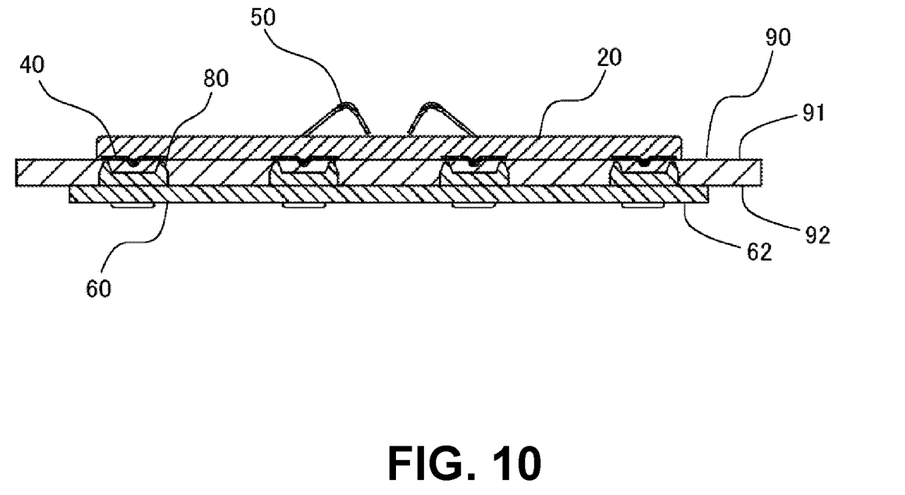
FIG. 10 is a cross-sectional view of the electrical connector of FIG. 1 in a condition where it is attached to the cloth of FIG. 7, in accordance with an embodiment.

FIG. 10 is a cross-sectional view of the electrical connector 10 in a condition where it is attached to the cloth 90. FIG. 10 shows a cross section taken along a DD line in FIG. 7.

As shown in FIG. 10, the tip portion of the second projecting portion 80 of the plate 60 cuts into the cloth 90 and can press the cloth 90 hard against an area along the perimeter of the conductive pad 40. This can prevent the conductive pattern 94 from being misaligned with the conductive pad 40. For example, the second projecting portions 80 can press the cloth 90 hard against a plurality of points around the protrusion 42, thereby enabling reduction in misalignment of the conductive pattern 94 with the conductive pad 40 even if the cloth 90 stretches, compresses or slips out of place on the outside of an area surrounded by the points.

With the electrical connector 10 described above, the conductive pad 40 is provided with a protrusion 42, which allows an increased area of contact with the conductive pattern 94. In addition, the first projecting portion 70 can press the conductive pattern 94 hard against the protrusion 42. Further, the second projecting portions 80 can press the conductive pattern 94 against the area along the perimeter of the conductive pad 40, so that misalignment of the conductive pattern 94 with the conductive pad 40 due to stretch, compression or the like of the cloth 90 can be reduced. In this manner, electrical connection can be stably provided between the conductive pattern 94 and the conductive pad 40.

Further, the boss portion 28 is cut into the cloth so that the electrical connector 10 is attached to the cloth 90, which eliminates preprocessing such as punching a hole in the cloth 90 prior to a step of attaching the electrical connector 10 to the cloth 90. Thermal welding or thermocompression bonding is performed to fix the boss portion 28 to the plate 60 with the conductive pattern 94 pressed against the conductive pad 40, which can cause the conductive pad 40 to firmly contact the conductive pattern 94. This eliminates a step such as joining a conductive member of the electrical connector to the conductive pattern 94. Accordingly, shaping the electrical connector 10 into one that suitable to a joining step is not required, allowing reduction in size of the electrical connector 10. In addition, the electrical connector 10 can be designed with more flexibility.

Figure 11:
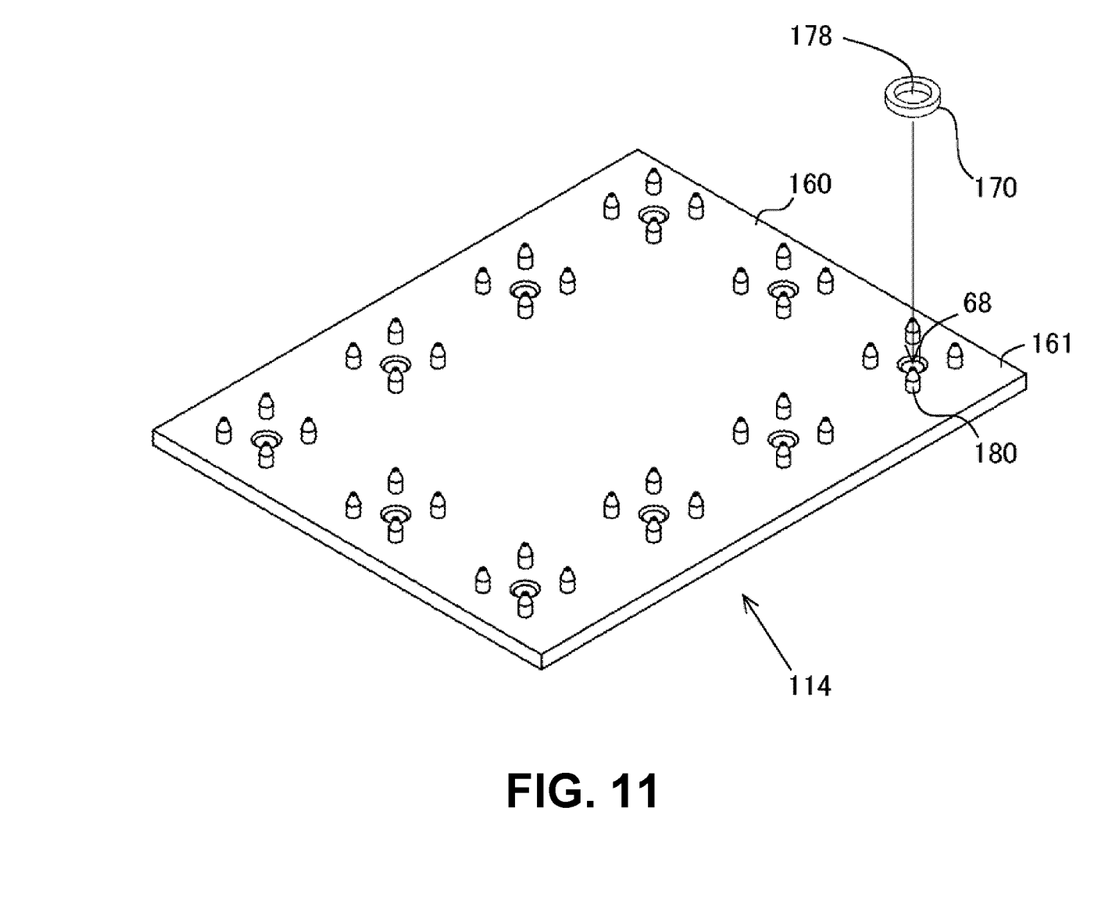
FIG. 11 is an exploded perspective view of a second member in a first variation of an electrical connector, in accordance with an embodiment.

FIG. 11 is an exploded perspective view of a second member 114 in a first variation of the electrical connector 10. The second member 114 includes a plate 160 and a first projecting portion 170. An upper surface 161 of the plate 160 is provided with a second projecting portion 180. The second projecting portion 180 has a shape similar to that of the second projecting portion 80.

The first projecting portion 170 is a member separate from the plate 160. The first projecting portion 170 has a shape similar to that of the first projecting portion 70. The first projecting portion 170 is an annular member having a through-hole 178 with a center into which the boss portion 28 is to be inserted. The first projecting portion 170 has a shape touching the second projecting portions 180 located outside the first projecting portion 170. This allows the first projecting portion 170 to be attached to the plate 160 such that the outer side of the first projecting portion 170 touches each of the second projecting portions 180. As a result, the first projecting portion 170 is positioned on the plate 160 such that the through-hole 178 of the first projecting portion 170 is aligned with the hole 68 for fixation.

The first variation of the electrical connector 10 has an effect similar to that achieved by means of the above-described electrical connector 10. Further, according to the first variation, the height of the first projecting portion 170 can be changed according to the height of the protrusion 42, the thickness of the cloth 90, the hardness of the protrusion 42, or the like. Accordingly, the pressure with which the protrusion 42 is pressed against the cloth 90 can be easily adjusted.

Figure 12:
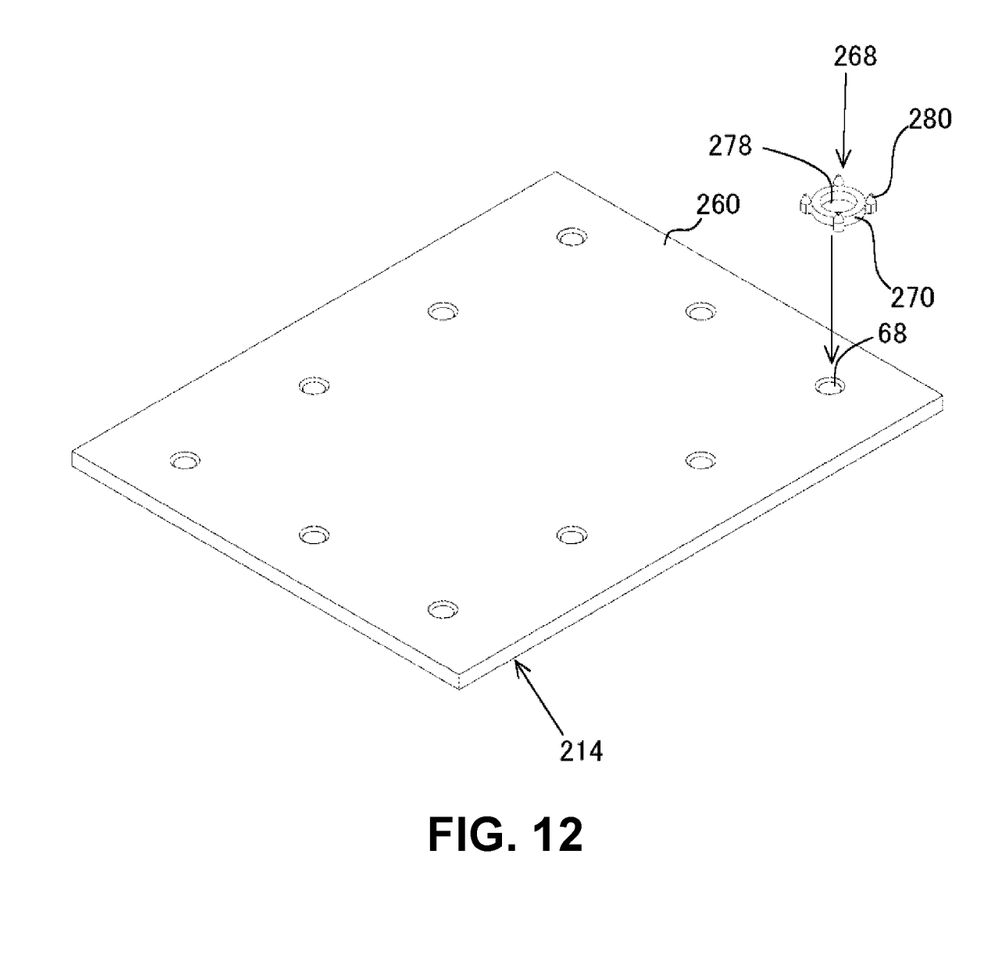
FIG. 12 is an exploded perspective view of a second member in a second variation of an electrical connector, in accordance with an embodiment.

FIG. 12 is an exploded perspective view of a second member 214 in a second variation of the electrical connector 10. The second member 214 includes a plate 260 and a projecting member 268. The projecting member 268 has a first projecting portion 270 and a second projecting portion 280. The projecting member 268 has a shape which is a combination of the shapes of the first projecting portion 70 and the second projecting portion 80.

The first projecting portion 270 has a shape similar to that of the first projecting portion 70. The first projecting portion 270 is a member having a through-hole 278 with a center into which the boss portion 28 is to be inserted. The second projecting portion 280 is provided around the circumference of the first projecting portion 270. The projecting member 268 is fixed to the plate 260 with the center of the through-hole 278 aligned with the center of the hole 68. The projecting member 268 is fixed to the plate 260 with, for example, adhesive.

The second variation of the electrical connector 10 has an effect similar to that achieved by means of the above-described electrical connector 10. Further, according to the second variation, a combination of the heights of the first projecting portion 270 and the second projecting portion 280 can be changed according to the height of the protrusion 42, the thickness of the cloth 90, the hardness of the protrusion 42, or the like. Accordingly, the pressure with which the protrusion 42 is pressed against the cloth 90 can be easily adjusted.

As used herein, the term "cloth" is intended to include various textiles (e.g., whether formed by weaving, knitting, crocheting, knotting, tatting, felting, bonding, braiding, or the like). The connection structure of the above-described receptacle 100 can be applied to such various textiles.

Of course, the above described embodiments are intended to be illustrative only and in no way limiting. The described embodiments are susceptible to many modifications of form, arrangement of parts, details and order of operation. The disclosure is intended to encompass all such modification within its scope, as defined by the claims.

What is claimed is:

1. An electrical connector to be attached to a cloth in which a conductive pattern is formed, the electrical connector comprising:

an insulating housing including a boss portion provided on a surface of the housing, the surface to be in contact with the cloth, and the boss portion being inserted into the cloth;

a connection terminal provided to the housing; and a conductive pad provided around the boss portion on the surface of the housing, the surface to be in contact with the cloth, and the conductive pad electrically connected to the connection terminal;

wherein the conductive pad has a protrusion protruding in the same direction as the boss portion protrudes.

2. The electrical connector according to claim 1, wherein a tip of the boss portion is sharpened.

3. The electrical connector according to claim 1, wherein the housing includes a plurality of boss portions provided on the surface to be in contact with the cloth and inserted into the cloth, the electrical connector comprises a plurality of conductive pads provided around the respective boss portions and electrically connected to the connection terminal, and the plurality of conductive pads each include the protrusion.

4. The electrical connector according to claim 1, further comprising an insulating plate for placing the cloth between the plate and the housing.

5. The electrical connector according to claim 4, wherein a hole for receiving the boss portion is formed in the plate.

6. The electrical connector according to claim 5, wherein the plate includes a first annular projecting portion provided on a surface of the plate, the surface to be in contact with the cloth, and the first projecting portion having a flat surface configured to be aligned with the protrusion.

7. The electrical connector according to claim 5, wherein the hole is a through-hole penetrating from the surface to be in contact with the cloth to a surface opposite to the surface to be in contact with the cloth.

8. The electrical connector according to claim 7, wherein a part of the boss portion which protrudes out of the through-hole is fixed to the plate by thermal welding or thermocompression bonding.

9. The electrical connector according to claim 5, wherein the plate includes a plurality of second projecting portions provided around the hole on the surface to be in contact with the cloth.

10. The electrical connector according to claim 9, wherein the plate includes a first annular projecting portion provided on the surface to be in contact with the cloth and having a flat surface aligned with the protrusion.

11. The electrical connector according to claim 10, wherein the plurality of second projecting portions is provided outside the first projecting portion and protrudes above the flat surface of the first projecting portion.

12. The electrical connector according to claim 10, wherein the first projecting portion and the plurality of second projecting portions are provided integral with the plate.

13. The electrical connector according to claim 10, wherein the first projecting portion is a member separate from the plate and has a shape touching the plurality of second projecting portions located outside the first projecting portion.

* * * * *